United States Patent [19]

Gray, Jr.

[11] Patent Number: 4,523,145
[45] Date of Patent: Jun. 11, 1985

[54] APPARATUS FOR THE AUTOMATED HANDLING AND TESTING OF ELECTRONIC MODULES

[75] Inventor: George G. Gray, Jr., Mattapoisett, Mass.

[73] Assignee: Raytheon Company, Lexington, Mass.

[21] Appl. No.: 395,953

[22] Filed: Jul. 7, 1982

[51] Int. Cl.³ .................... G01R 31/02; G01R 15/12
[52] U.S. Cl. ............................ 324/158 F; 324/73 AT
[58] Field of Search ............ 324/158 F, 73 AT, 73 R, 324/158 P

[56] References Cited

U.S. PATENT DOCUMENTS 3,238,455  3/1966  Jankowski ...................... 324/158 F Primary Examiner—Ernest F. Karlsen
Attorney, Agent, or Firm—Martin M. Santa; Joseph D. Pannone; Richard M. Sharkansky

[57] ABSTRACT

Apparatus is provided for the automated handling and testing of semiconductor electronic modules which are stored in successive slots along the length of a magazine or container. The magazine is moved lengthwise in step-wise fashion and indexed to cause each module to assume in succession a position over an electrical connector. The connector is mechanically moved to make electrical contact with the electrical connector of the module. The module is thereby connected to an electrical test set which tests the module and provides a signal indicating whether the module has passed or failed and the module is so marked. The modules sequence through the test procedure until all have been tested, at which time the magazine is returned to its initial position.

10 Claims, 12 Drawing Figures

APPARATUS FOR THE AUTOMATED HANDLING AND TESTING OF ELECTRONIC MODULES

BACKGROUND OF THE INVENTION

This invention relates to apparatus for the automated handling and testing of semiconductor electronic modules and is an improvement which incorporates the connector described in U.S. patent application Ser. No. 336,759 filed Jan. 4, 1982 by the inventor of this invention and assigned to the assignee of this invention.

In the procedure for the testing of modules prior to the instant invention, the modules were packaged in a container for shipment from the assembly region to the test region. At the test region, the modules were removed from their cardboard boxes and loaded in bulk into stainless steel mesh trays and placed in an oven where they were temperature cycled over a temperature range of −50° C. to +85° C. for the desired period of time. The mesh trays allow air circulation around the modules for quick thermal response of the modules. After thermal conditioning, considerable labor time was spent removing the modules from the mesh trays and replacing them in their cardboard boxes by module type and serial number order. These boxed modules were then transmitted to a test equipment station which utilized the test connector referred to in the previous paragraph. The modules were individually removed by the operator, placed in the connector test set-up, removed after testing and placed back in the container after acceptance stamping if the module passed.

It is apparent that the above process with the handling of modules during the test acceptance procedure is labor intensive and expensive. It is therefore an object of this invention to minimize the number of steps of manual handling of the modules by the utilization of the invention to be described. Other objects and features of the invention will become apparent from the following description of the invention.

SUMMARY OF THE INVENTION

The aforementioned problems are overcome and other advantages are provided by a semiconductor module automatic handling system which, in accordance with the invention, provides for the thermal and electrical testing of the module while the module is contained within the magazine in which the module has been placed directly after fabrication. The module is retained in the magazine for additional packaging for shipment in the event that the module passes its electrical acceptance test or is removed if the module fails to pass the test.

In implementing the automatic handling system of this invention, the semiconductor modules which are to be tested are inserted manually into a magazine prior to being temperature cycled as in the prior art. Prior to being inserted into the magazine, the modules have been stamped to identify their type and their serial number before being placed in serial fashion into the magazine. After temperature cycling, the magazine is inserted into the indexing mechanism for electrical testing. The indexing mechanism sequentially indexes each module contained within the magazine over a test set connector. When a module has been indexed to be directly above the test set connector, the connector is mechanically moved to make contact with the electrical pins of the module and displaces the module sufficiently from its nested location within the magazine to expose the upper portion of the module to a stamp pad which, if the module passes its electrical test, is actuated to indicate on the module by the stamp pad that the module has passed the test. After either failing or passing the electrical test, the module is caused to become nested again within the magazine by the withdrawal of the test set connector. The indexing mechanism of the indexer causes the magazine to advance to the next test module position where the process of testing the module is repeated. After all the modules in the magazine have been tested, the indexer releases the magazine and returns the magazine to the position at which it was originally inserted at which time the magazine may be removed and another magazine containing modules to be tested is inserted into the indexing device and the process repeated.

BRIEF DESCRIPTION OF THE DRAWINGS

The aforementioned aspects and other features of this invention are explained in the following description taken in conjunction with the accompanying drawings, wherein.

DESCRIPTION OF THE PREFERRED EMBODIMENT

Figure 1:
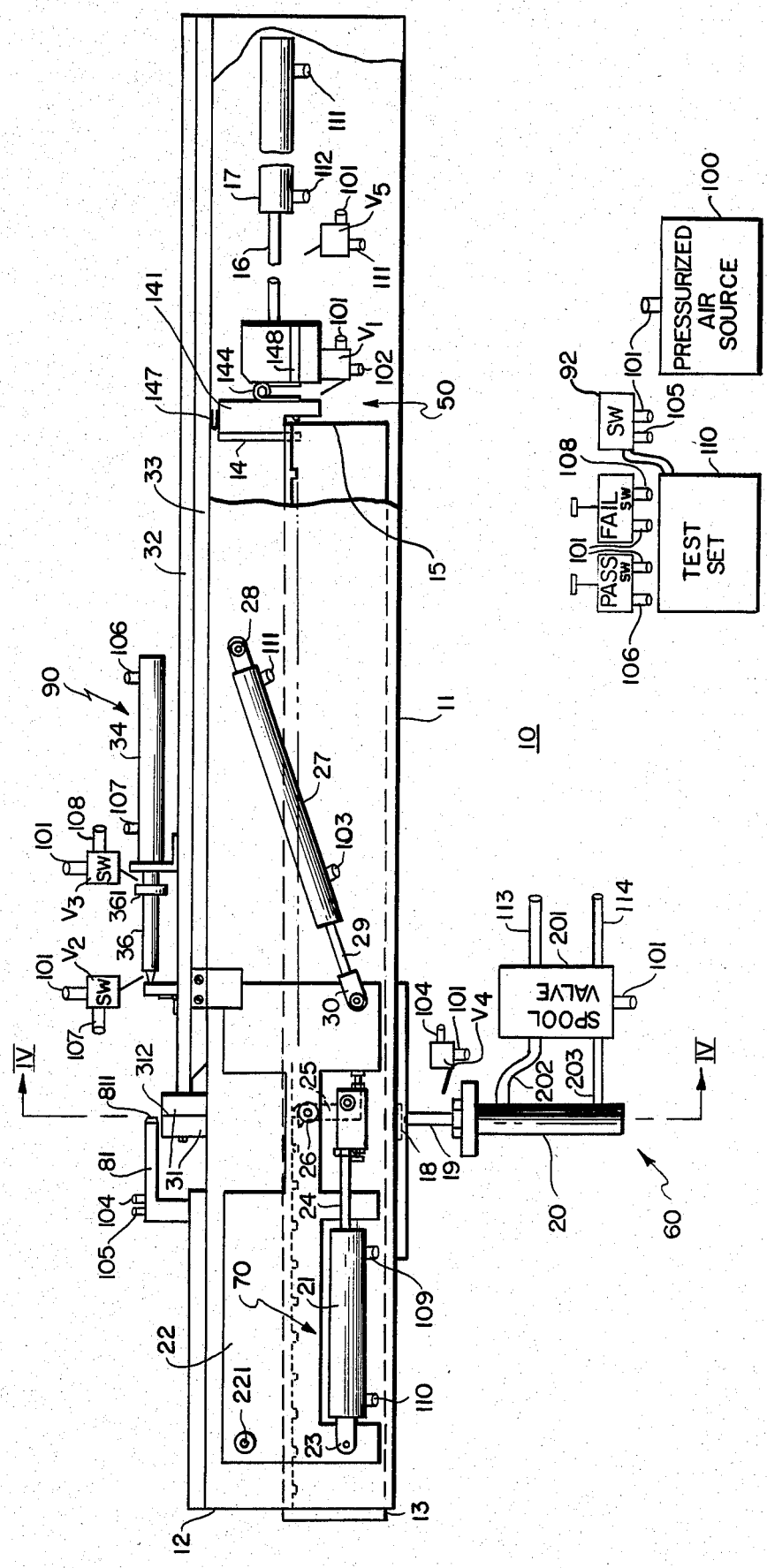
FIG. 1 is a side view of the apparatus of this invention.

An overall view of the automatic module handling apparatus 10 of this invention is shown in side view in FIG. 1. The apparatus 10 comprises a breech 11 into which the magazine 13, for holding the modules to be tested, is inserted. For purposes of clarity in the drawing, the magazine 13 is shown without any modules. Attached to the breech 11 is the feed mechanism 50, the connector mechanism 60, the indexing mechanism 70 and the stamping mechanism 90. The feed mechanism 50 draws the magazine 13 into the breech 11 against the intermittent restraint provided by the indexing mechanism 70. The feed mechanism 50 comprises a latch 14, which engages the end 15 of magazine 13 and is attached to the piston 16 of cylinder 17. A cylinder 21 is attached to arm 22 at pivot 23. The indexing mechanism 70 comprises a cylinder 21 having a piston 24 pivotally connected to an arm 25 also pivotally attached to arm 22 at pivot 26. Another portion of the indexing mechanism 70 is a cylinder 27 attached at pivot 28 to the breech 11 with its piston 29 attached at pivot 30 to the arm 22. Electrical connection of the module to be tested with the test set 110 is made by urging the electrical contacts of a connector 18 against the electrical contacts of a connector forming a part of the module. The connector 18 is attached to a pneumatic cylinder piston 19 which, when retracted into cylinder 20, causes connector 18 to make contact with the module connector thereby pushing the module against stops within module guides 31 attached to the breech 11. The stamping mechanism 90 comprises a pneumatic cylinder 34 having a stamp 35 which is operator or automatically activated to mark the module under test as having "passed" when the test set 110 provides a "passed" signal.

Figure 2:
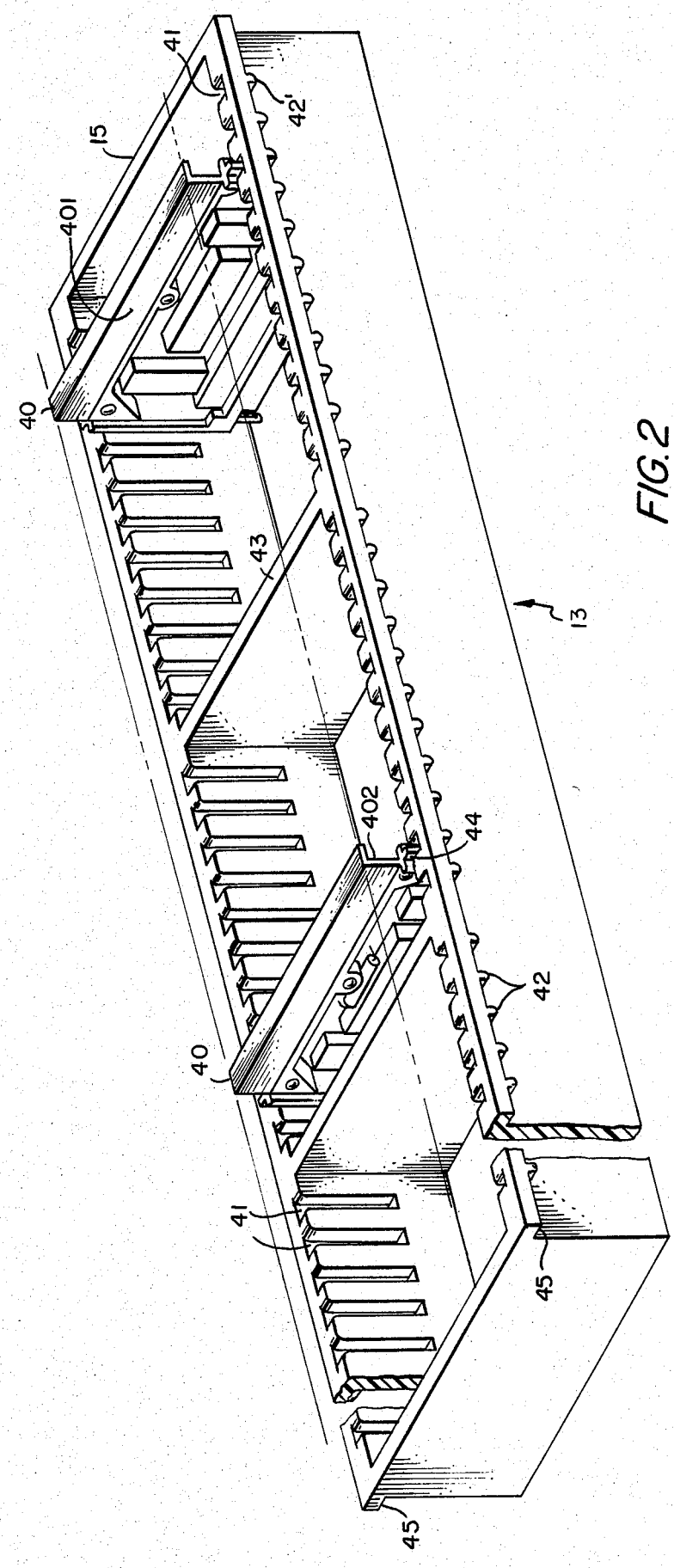
FIG. 2 is an isometric view of the magazine containing modules to be tested in the apparatus of FIG. 1.

The magazine 13 which holds the modules 40 is shown in more detail in FIG. 2. The magazine 13 is typically of molded plastic wherein the slots 41, the projecting indexing tabs 42, and reinforcing walls 43 are provided during the molding operation. The slot 41 is wider than the module guide arm 44 thereby allowing some longitudinal movement of the module 40 with respect to the slot 41. The indexing tabs 42 have a predetermined location with respect to the slots 41 so that the location of a slot 41, and hence that of the module 40 contained within that slot, is determined by the corresponding indexing tab 42. It is preferred that the center of the indexing tab 42 be located at the center of the slot 41 so that the magazine 13 is end for end reversible thereby requiring only that the modules 40 be inserted with the faces 401 of their nonsymmetrical top portions all facing in the same direction as shown in FIG. 2. For the arrangement of the modules 40 shown in FIG. 2, the end 15 of the magazine 13 is the end which is inserted first into the open end 12 of the breech 11 for reasons to be explained subsequently. For a more detailed description of the module 40, reference may be made to copending U.S. Pat. No. 4,441,140 assigned to the assignee of this application.

Figure 3:
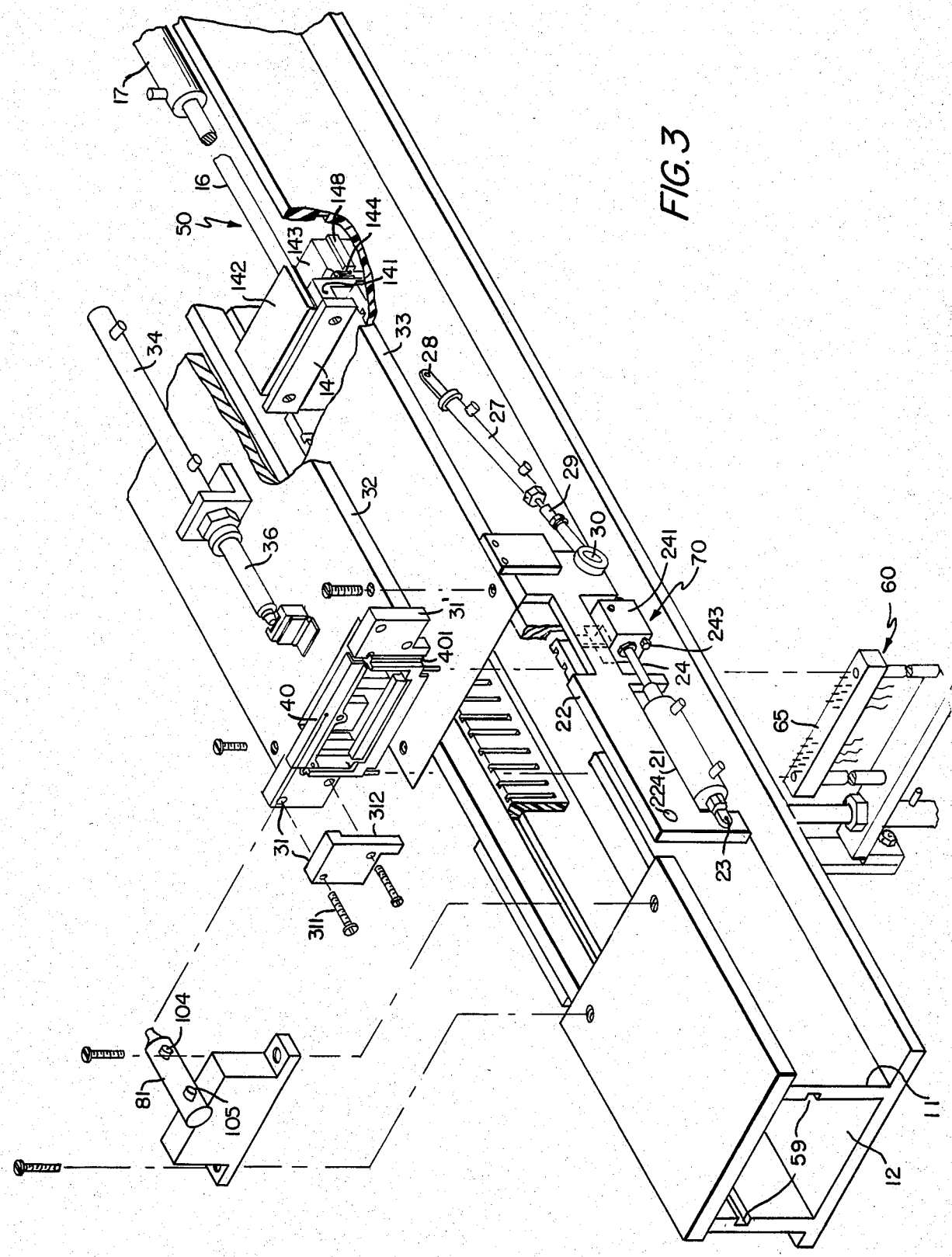
FIG. 3 is a partially exploded isometric view of the apparatus of FIG. 1.
Figure 4:
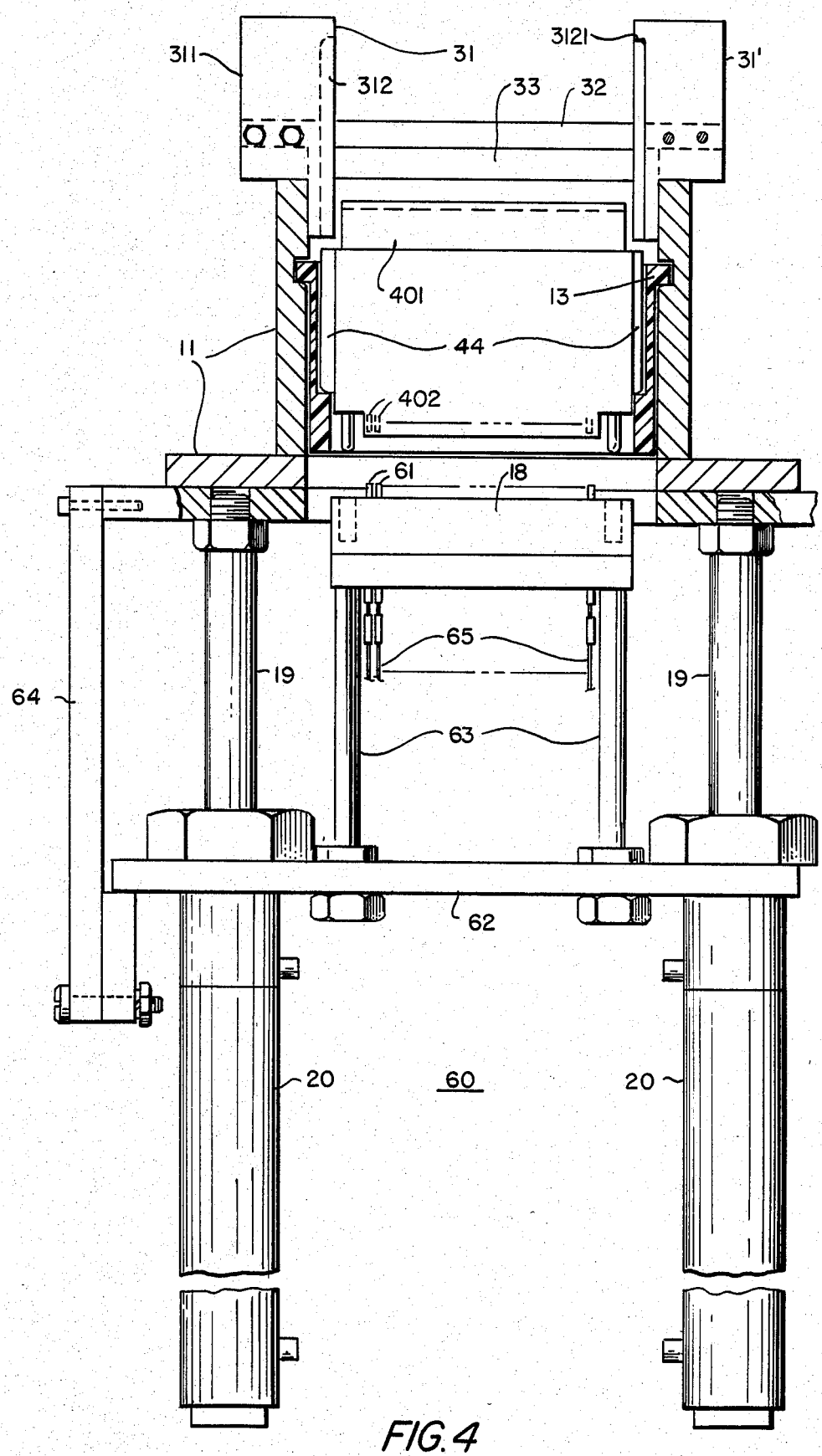
FIG. 4 shows the electrical connector and its actuating mechanism in relation to a module to which the connector is to be connected.

An isometric view of the apparatus 10 of this invention is shown in partial cross-section and partially in exploded view in FIG. 3 to show more clearly certain aspects of the invention than are shown in FIG. 1. The slots 59 in the breech 11 are provided to support the magazine 13 by its edges 45. The connector 18 of connector actuating assembly 60 is shown in FIG. 4 in its retracted position and is shown with its electrical contact pins 61 extending beyond the connector 18 in order to facilitate electrical contact to be made to the pins 402 of the module 40. The connector 18 is attached to a support bar 62 by bolts 63. A mechanical stop 64, which limits the downward movement of the support bar 62, is attached to the breech 11. A cylinder 20 is secured to the support bar 62 and its piston 19 is secured to the breech 11. With this mechanical arrangement, extension of piston 19 causes connector 18 to move away from module 40 and vice versa. The wires 65 are attached to pins 61 and are connected to a test set for testing of the module 40 as described in copending U.S. patent application for a connector, Ser. No. 336,759, assigned to the assignee of this application.

Figure 5:
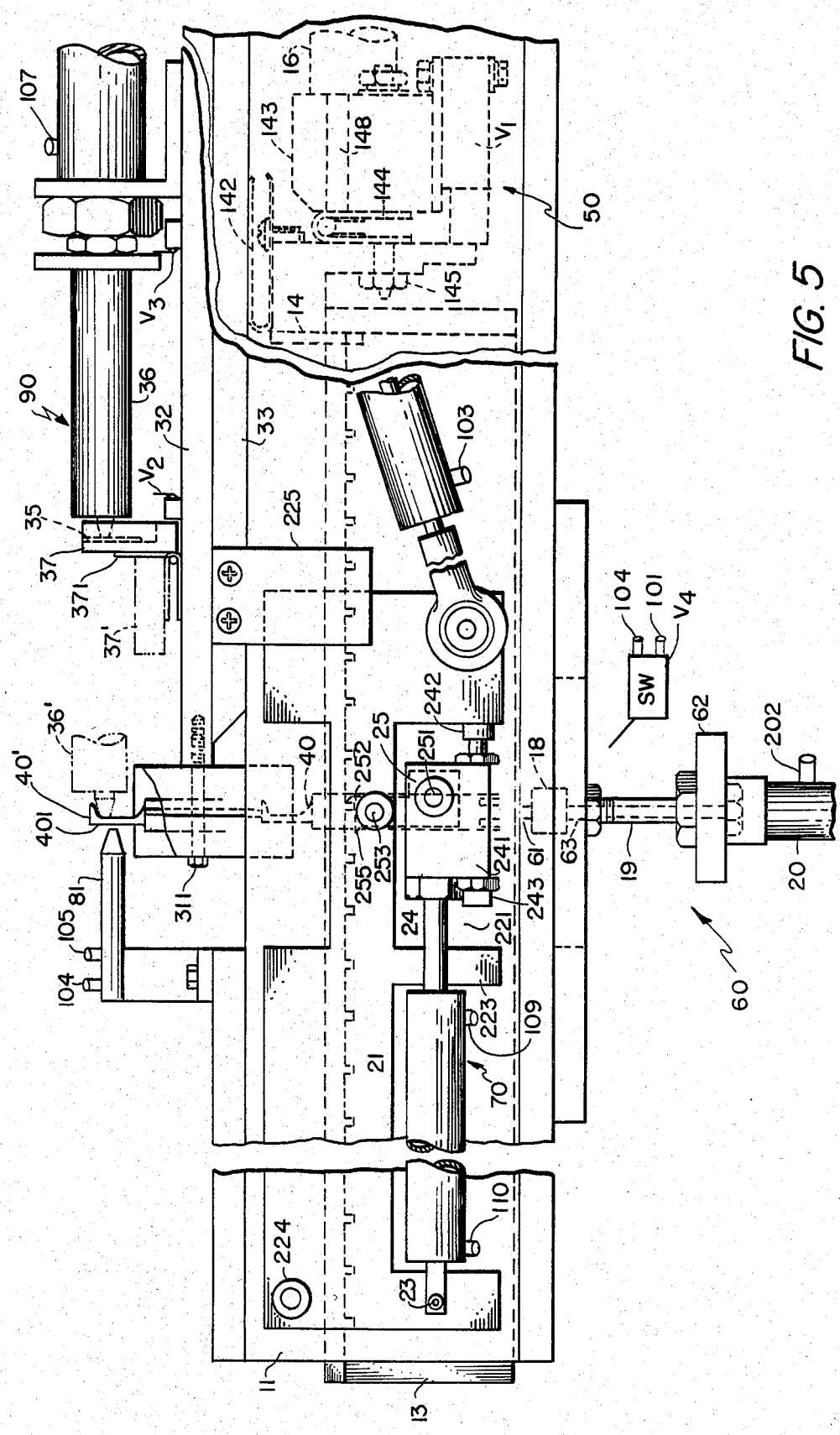
FIG. 5 is a side view showing in detail the indexing mechanism.

The view of the connector actuating assembly 60 shown in FIG. 4 is a cross-sectional view of the breech 11 at section IV—IV of FIG. 1; the indexing mechanism 70 is not shown. The connector assembly 60 comprises the module guides 31 which were mentioned previously. Module guides 31 are attached to a mounting plate 32 which is in turn attached to the cover plate 33 of the breech 11 as shown in FIG. 5. The module guides 31 are assembled with screws 311 to form a guide assembly 311 having a slot 312 which is in alignment with the centerline of the connector pins 61 of connector 18. The slot 312 is only slightly larger than the guide 44 of the module 40 so that module 40 is accurately positioned within the guide assembly 311 to cause the module pins 402 to be aligned with the pins 61 of connector 18 so that, when the pins are in contact with one another, the force produced in the pins by the actuating piston 20 will not cause bending of the pins.

Referring again to FIGS. 1 and 3, a magazine pulling mechanism 50 is seen to be comprised of the latch 14 attached to latch body 141 having a guide spring 142 in contact with the upper plate 33. Latch body 141 is attached to latch support block 143 by springed hinge 144. Latch support block 143 has side projecting guides which slide in and are supported by slots 59 of breech 11. FIG. 5 further shows in phantom the magazine feed mechanism 50 containing an adjustable mechanical stop 145 attached to the latch support block 143 in addition to the elements previously recited. Latch support block 143 is attached to piston 16 of cylinder 17.

Also shown in the figures is the air switch 81 whose end 811 is in proximity to the module face 401 when the module 40 is in the position 40'.

FIG. 5 shows in more detail than in FIGS. 1 and 3 the indexing mechanism 70, the stamping mechanism 90, and the magazine feed mechanism 50. The indexing mechanism 70 comprises the block 241 which is attached to the indexing cylinder piston 24. Cylinder 24 attached to piston 14 is attached to arm 22 at pivot 23. The block 241 is connected to the indexing pawl 25 at pivot 251. Block 241 has mechanical stops 242, 243 adjustably secured to it to limit the motion of the block within the space 221 between the projections 222, 223 of arm 22. Indexing pawl 25 is connected by pivot 253 to the arm 22 which is supported at pivot 224 to the breech 11. The guide 225 constrains the arm 22 from any tendency to lateral motion.

FIG. 5 shows the module 40 in its normal position within the magazine 13 and also shows the same module in its test position as phantom module 40'. The phantom module 40' is placed in its test position by the connector mechanism 80 as will be explained later in the section on operation of the apparatus. FIG. 5 further shows the stamp 35 in phantom 35' in its position when stamping the phantom module 40'. The figures show the stamp pad holder 37 is shown in its upright position with the stamp 35 in inking contact with the stamp pad 372. The stamp pad holder 37 is also shown in phantom in its horizontal position as holder 37' which it assumes when the stamp 35' is in position occupied by phantom stamp 37'. The springed hinge 371 which supports the stamp pad holder 37 is also shown in its position 371' which it assumes when the stamp 35 is in its position 35' in contact with module 40 in position 40'. The piston 36 has a projecting ring 361 which contacts air valves $V_3$ and $V_2$ when the stamp 35 is in contact with stamp pad 372 and phantom module 40', respectively.

Figure 11:
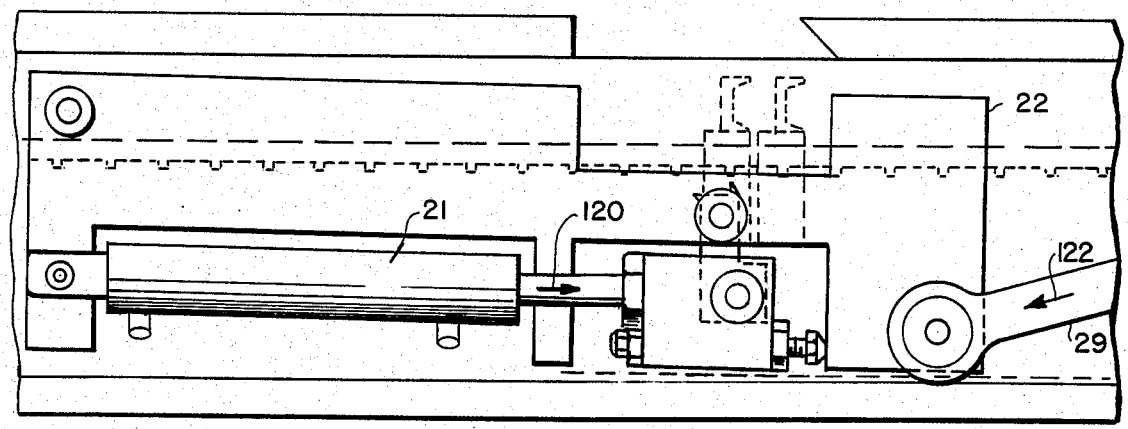

The state of the apparatus 10 when ready to be loaded with the magazine 13 is that pistons 16, 19, 24, 29 are extended, and piston 36 is retracted. Initialization of the apparatus 10 is accomplished by connecting it to the pressured air source 100 which provides air pressure on line 101 to the appropriate inputs of the various cylinders of the apparatus. Since the initial position of pistons 16, 19, 24 and 29 is in the extended position, line 101 is connected to the extend inputs 112, 114, 109, 111 and 171 of the corresponding cylinders 17, 20, 21 and 27. Similarly, the piston 36 is in its retracted position and, therefore, line 101 is connected to the retract input 107 of the cylinder 34. Application of air pressure to the input 111 of cylinder 27 causes its piston 29 to extend thereby moving the arm 22 to a non-horizontal position as shown in FIG. 11 during this initialization procedure. The application of air pressure to the input 107 of cylinder 34 causes the stamp pad piston 36 to retract to its position shown in FIG. 1. At this initialized position, the piston 36 causes the stamp 35 to be in contact with the stamp pad 372 as shown in FIG. 5. It will be understood in the subsequent description that the cylinders, valves, and lines are pneumatic elements.

Figure 6:
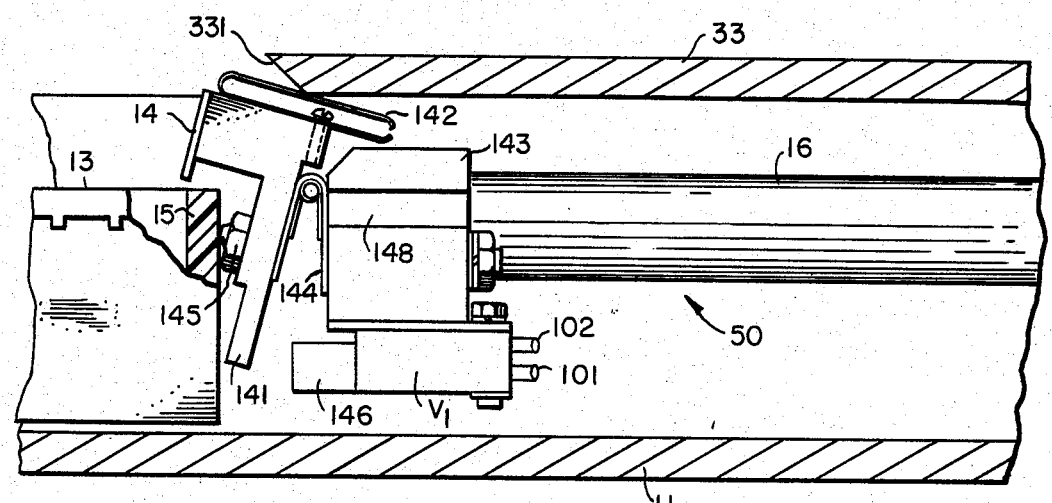
FIGS. 6 and 7 show the magazine latch in its open and closed positions, respectively.

Under these conditions, pawl 25 is in a vertical attitude with its extension 25' ready to obstruct the passage of tab 40' of magazine 13 as the magazine is pushed into the breech. Piston 29 has pulled arm 22 upward to a horizontal position to move pawl 25 closer to the tabs 40 of magazine 13 so that its extensions 251, 255 will be capable of intercepting the tabs 40 during operation of the apparatus 10. The extension of piston 16 causes the latch 14 to be tilted and ready for the insertion of the magazine as shown in FIG. 6. The extension of piston 19 causes the connector 18, which is attached to the cylinder 20 of piston 19, to be removed sufficiently for the bottom of magazine 13 to provide clearance for longitudinal movement of magazine 13 within breech 11. The retraction of piston 36 causes the stamp 35 to be in inking contact with the stamp pad 372.

In operation, the magazine 13 is loaded with modules 40 having their faces 401 in the opposite direction from the end 15 of magazine 13. End 15 is inserted first into the opening 12 of the breech 11 with the supporting edges 45 of magazine 13 resting in the grooves 59 of breech 11.

Figure 7:
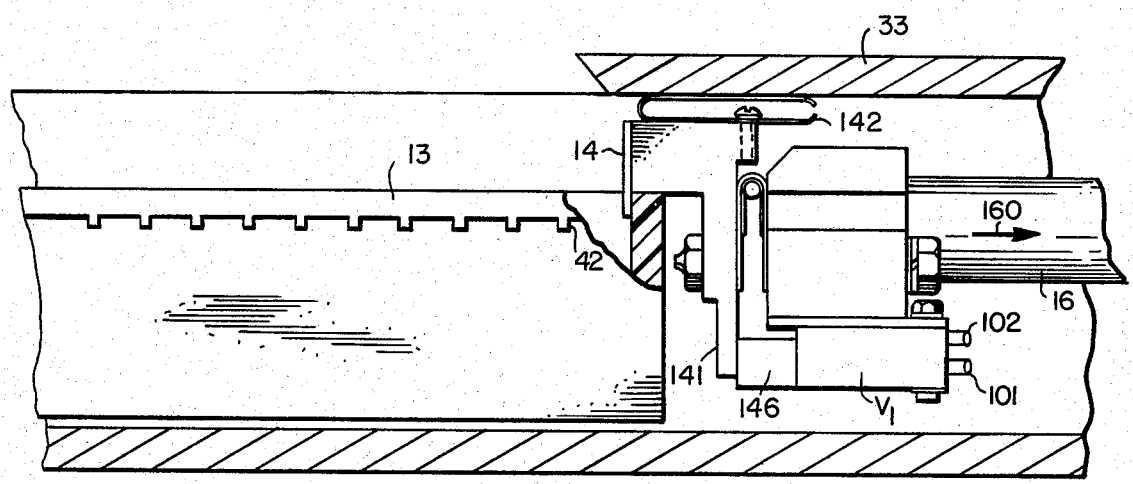
Figure 10:
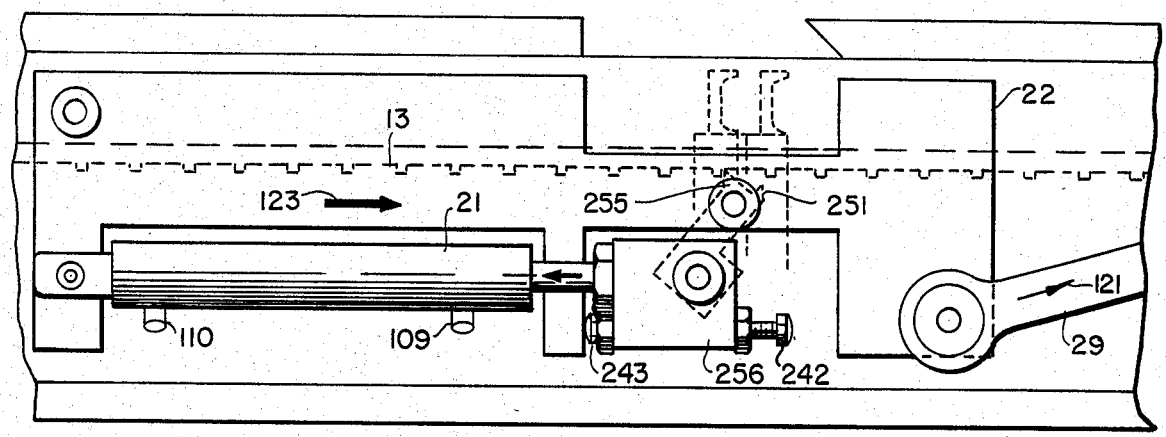

Referring now to FIG. 6, the piston 16 of the feed mechanism 50 is shown in its fully extended position awaiting the insertion of the magazine 13. It will be observed that the latch 14 has been tilted with respect to the vertical direction by the ultimate extension of the piston 16 to a point where the hinged spring 144 causes the latch support 141 and the latch 14 to rotate. Plate 33 has a leveled end 331 to allow latch 14 to rotate. With the latch 14 in its tilted position, the magazine 13 will clear the bottom edge of the latch 14 and is manually inserted in breech 11 striking the stop 145 mounted on latch support 141. The magazine 13 is manually pushed further into the breech 11 against the resistance of the spring 144 of support 141 until the latch 14 assumes the vertical position shown in FIG. 7 and engages the end 15 of magazine 13. The latch support 141 depresses the actuating arm 146 to open the pneumatic valve $V_1$ and cause pressurized air to exist on line 102. Latch 14 is retained in the vertical position by the spring 142 attached to support 141 pressing against the plate 33. Line 102 is connected to retract input 112 of the magazine feed actuating cylinder 17 to cause the piston 16 to move as shown by direction arrow 160 in FIG. 7. Piston 16 will move magazine 13 in the direction of arrow 160 until the endmost tab 42' of its magazine engages the extension 252 of the indexing pawl 25. When the magazine is stopped by pawl extension 252, the module 40 (not shown) contained in the first slot 41' will have its guide arms 44 in substantial alignment with the guide slots 312 of the guide blocks 31. Line 102 is also connected to retract input cylinder 27 to cause arm 22 to become horizontal as shown in FIGS. 1 and 10 in response to the opening of valve $V_1$.

Referring again to FIG. 1, when valve $V_1$ is actuated by the latch support 141, line 102 also provides air pressure to the numbered input 113 of shuttle valve 201 which causes valve 201 to switch the air pressure at its input line 101 to the retract input 202 of cylinder 20. Air pressure on line 202 of cylinder 20 causes piston 19 to retract. Since connector 18 is attached to cylinder 20, retraction of piston 19 causes connector 18 to move toward the module and to push the module 40 by its electrical pins 402 up into slots 312 of guide blocks 31 until the module 40 reaches the stops 3121 at which location the module 40 is ready to be electrically tested.

Each cylinder has an associated shuttle valve such as that just described for cylinder 20. Each shuttle valve has an input pressure line 101 connected to the source 100. The valve also has two output lines, either of which is connected to the air source line 101, depending upon which of two input lines is provided with air pressure. The output lines of the shuttle valve are connected to the extend and retract input lines of the cylinder. Although each cylinder has such a shuttle valve, only one such valve is shown in FIG. 1, but it should be understood that each cylinder has such a valve and that, in the description of the invention, a reference to a retract or extend input of a cylinder refers to the corresponding input of the shuttle valve connected to the cylinder.

As stated earlier, the spring of valve $V_1$ allows air pressure from line 101 to be transmitted through line 102 to the retract input 114 of connector cylinder 20. The resultant retraction of piston 19 causes the connector 18 ends of pins 61 to come in contact with the ends of pins 402 of module 40 and to push module 40 up into the module guide 31 where it is stopped when the module guides 401 strike the top 3121 of the slots 312 of guide 31. Since the slot 312 is only slightly larger than the module projections 44, the module is very accurately aligned with the plug 18 so that the pins 61 of the connector can exert significant pressure against the pins 402 of module 40 and thereby provide good electrical contact, as explained in detail in the copending application which has been referenced earlier. As the connector 18 moves the module 40 up into the guide 31 to the test position module 40', the connector support bar 62 contacts the actuating arm of air valve $V_4$ to allow air to flow from line 101 to outlet line 104 to an input of proximity detector 81 which has an air outlet 105 connected to the air actuated electrical switch 92 electrically connected to the test set 110. When the module 40 has been properly inserted into the magazine 13, the face 401 of the module 40' will be in proximity to the opening 811 of the proximity detector 81. In that event, there will be sufficient flow of air in line 105 through the proximity detector 81 to actuate switch 92 and to cause the test set to apply power to the module and to perform the various tests. However, if the module has been inserted so that the remote portion 402 of the top of the module 40' is facing the end 811 of detector 81, there will be insufficient pressure through the line 105 to actuate switch 92 and instead the proximity switch 81 will emit a sound which notifies the operator of the machine that the module has been incorrectly inserted. In that event, the operator will cause the machine to advance to the next module by actuating the "Fail" switch 96 as will be explained subsequently.

Figure 8:
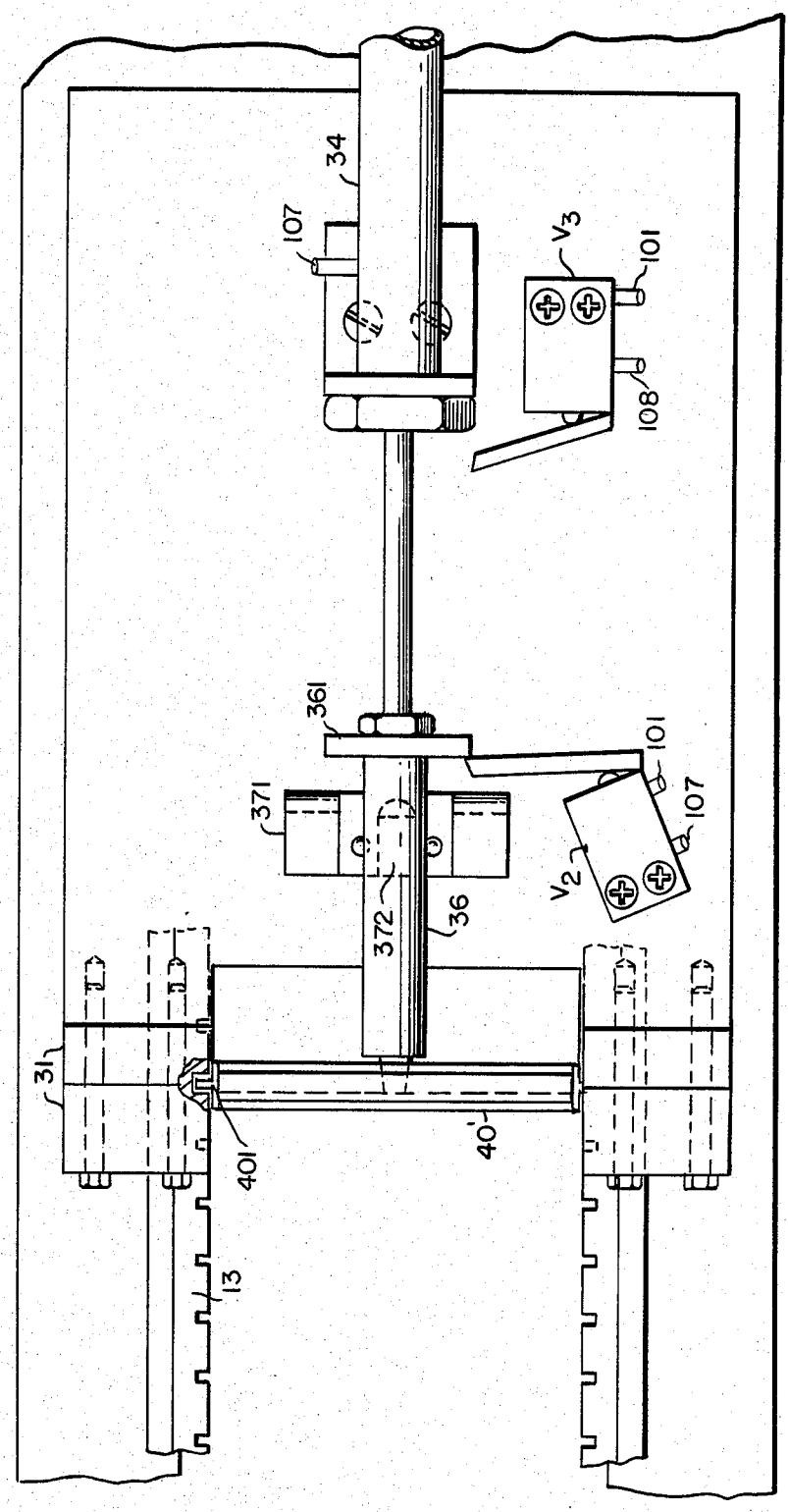
FIGS. 8 and 12 are top and side views, respectively, of the module stamping mechanism.

If it is assumed that the module 40 has been inserted correctly and switch 92 has been activated, the test set 110 applies various electrical signals to the module 40 through connector 18 and determines whether or not the module has passed or failed. The test set will provide to an operator an indication that the module has either passed or failed. In the event that the module has passed, the operator will actuate the "pass" air switch 93 which provides air pressure on line 106 to cause the piston 36 of cylinder 34 to extend, causing stamp pad support 37 to lie flat as pad support 37' shown in FIGS. 5 and 8. It will be apparent that the test set 110 could generate an electrical signal when a module has "passed" which would automatically electrically activate an air switch corresponding to switch 92.

Figure 9:
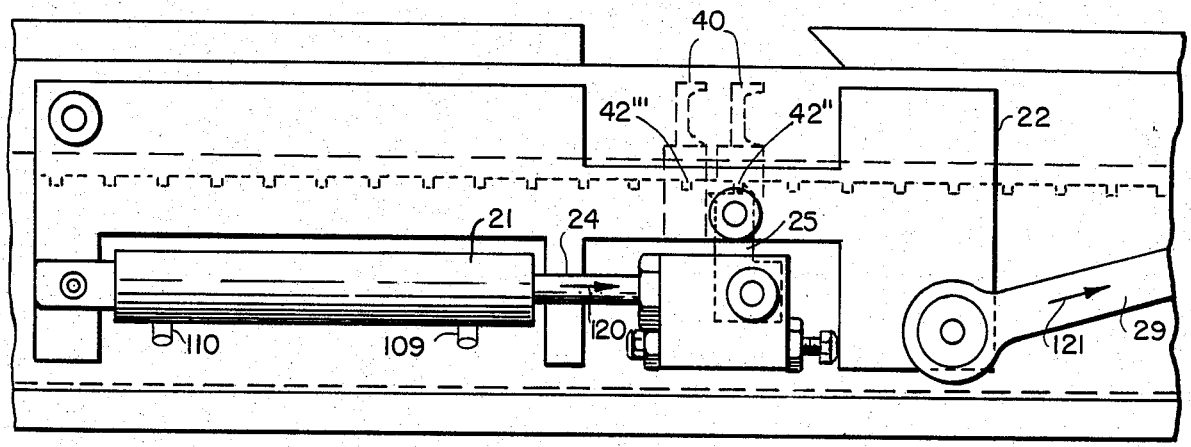
FIGS. 9, 10 and 11 show the indexing mechanism in various stages of operation.

When the stamp 35 is in the position of stamp 35' to mark module 40 as "passed", the piston ring projection 361 contacts air valve $V_2$ to cause air pressure to exist on line 107 which is connected to the retract input of cylinder 34 to cause the piston 36 to retract. Upon retraction of piston 36, the stamp 35 leaves module 40' and reaches its rest position where ring 361 actuates air switch $V_2$ which provides air pressure on line 108 to spool valve 211 which provides air pressure to the retract input 1091 of cylinder 21 and removes the air pressure on the line 1101 connected to the extend input of cylinder 21. Prior to spool valve 211 being actuated by the air pressure on line 109, the pawl 25 is in the vertical position as shown in FIG. 9 with its extension 251 engaging the tab 42″ of magazine 13. The direction arrow 120 of FIG. 9 shows the direction of the force applied to the piston 24 which keeps the pawl 25 in the vertical position resisting the turning moment produced by the pull on the magazine 13 by the piston 16.

The direction arrow 121 of FIG. 10 shows the direction of force being exerted on piston 29 to keep arm 22 in the upward horizontal position during the time that the modules are being tested.

FIG. 10 also shows the direction of the force in the direction of arrow 122 exerted by the piston 24 when spool valve 211 removes the pressure from line 1101 and instead applies the air pressure to line 1091. The pawl support block 256 moves to the left until its stop 243 strikes arm 22 at its projection 229 at which time the pawl 25 rotates about a pin 253 which is attached to the arm 22 to cause extension 251 to clear tab 42″ as shown in FIG. 10. The other end of the pawl 25 rotates about a pin 254 attached to the pawl block 256. As seen in FIGS. 9 and 10, the pawl extension 255 rotates into a position where it is capable of intercepting the adjacent magazine tab 42‴ as the magazine 13 is being pulled in the direction of direction arrow 123 under the pulling force exerted by the piston 16 of cylinder 17. The movement of pawl 25 by the block 256 must be sufficiently fast that the pawl extension 255 will be in the upward direction as shown in FIG. 10, where it is in a position to intercept the tab 42‴, before tab 42‴ of magazine 13 is pulled past pawl extension 255. Valve 211 is so designed that, after a predetermined period of time sufficient for magazine 13 to move in direction 123 to allow tab 42‴ to be engaged by pawl extension 255, the air pressure on line 1091 will be switched to line 1101 causing the piston 24 to move in direction 120. The pawl 25 moves to the vertical position which pushes the magazine 13 back to the left slightly as pawl extension 255 pushes on tab 42‴ until sliding off tab 42‴. Pawl 25 becomes vertical and extension 251 is in position to intercept tab 42‴ as magazine 13 is pulled in direction 123 under the force of the piston 16. The application of air pressure on line 1101 of cylinder 21 is followed by a delay sufficiently large to assure that the pawl 25 is in the vertical position and that the magazine 13 has moved to its position where extension 251 is once again restraining its movement, at which time a delay of sufficient magnitude is introduced by delay unit 95 to provide delayed air pressure in line 102 which is provided to the retract input terminal 102 of cylinder 20. The pressure in line 103 causes the piston 19 of cylinder 20 to retract and cause the connector 18 pins 61 to make electrical contact with the connector pins 402 of the module 40‴ for electrical testing of the module. Thus, the cycle is complete and testing will proceed in the same manner through the thirty-three modules 40 contained in the magazine 13.

After the last of the thirty-three modules in magazine 13 has been tested, the apparatus 10 will proceed to position the next non-existent module for testing. The air pressure in cylinder 21 has caused the pawl 25 to be in the vertical position, but there is no tab 42 on which the pawl extension 251 can catch. Therefore, the magazine 13 continues moving in direction 123 pull produced by piston 16 until such time as the latch support block 143 contacts pneumatic switch $V_5$. $V_5$ has a pressure input line 101 and a pressure output line 111 which is connected to the extend input line 111 of cylinder 27. Pressure in line 111 applied to cylinder 27 causes its piston 29 to extend and to rotate arm 22 about pivot 221 as shown in FIG. 1 from its horizontal position. The direction arrow 122 shows the direction of force being applied by the piston 29 upon the arm 22 to rotate it with respect to the pivot 221. The piston 29 moves the pawl 25 extensions out of the region of possible engagement with the magazine tabs 42 sufficiently rapidly so that the pressurized air may also be applied by switch $V_5$ to the extend input line 111 of cylinder 17. Piston 116 pushes on the latch support block 143 in a direction opposite direction arrow 160 of FIG. 7 to cause the magazine 13 to be pushed past and clears the pawl 25 and thus is in a position where it may be removed. The latch 14 rotates as shown in FIG. 6 and thereby opens switch $V_1$ and thereby removes the pressure in line 102. The system is maintained in this initial state until the next magazine loaded with modules 40 is introduced and the testing process described above is continued.

In the event that a module fails its electrical test, the test set 110 so indicates to the operator who may manually remove or mark the failed module with a distinctive color to indicate that it has failed. The stamp 35 is not actuated when test set 110 indicates a failed module. In order to have the system proceed once a module has been determined to have failed, the operator pushes the "fail" switch 96 which provides air pressure from source 100 to line 108 which is connected to line 108 at the switch $V_3$ which is normally actuated by the return of the stamp after a "passed" module has been stamped. The system will continue from that point as if the module had passed and proceed to the next module for testing.

Figure 12:
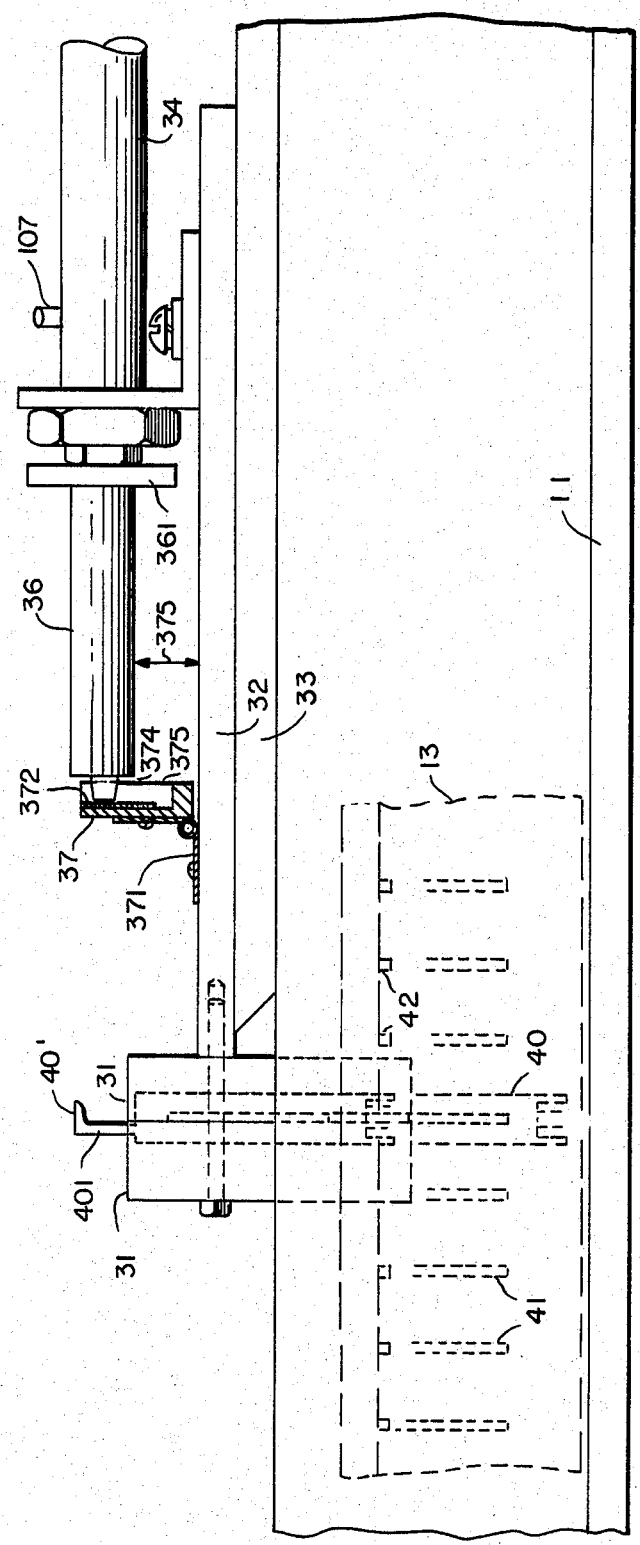

FIG. 12 shows the stamp mechanism 90 in more detail and also shows a module 40 in its rest position within the magazine 13 and also in its raised electrical test position as module 40'. The connector 18 which causes the module 40 to rise is not shown in the figure. The stamp pad 372 is shown in section along with its holder 37. The stamp pad piston 36 has had its diameter enlarged by a sleeve to press against the front surface 373 of holder 37 as piston 36 is advanced to stamp the module in order to push the holder 37 down against the restraining force produced by spring loaded hinge 371 without the stamp 35 producing a sliding contact with pad 372. The clearance 374 between the piston 36 and pad holder front surface 373 is small in order to remove the stamp 35 from contact with the pad 372 as soon as feasible as piston 36 is being extended consistent with ensuring that the stamp 35 is in inking contact with pad 372 when the piston 36 is fully retracted. The bottom of piston 36 is at a height 375 with respect to plate 32 which is greater than the height of front surface 373 when holder 37 is in its folded flat position in order to prevent jamming of the piston 36 and holder 37.

The air cylinders which have been described as having various valves or air switches connected to their extend and retract inputs should be understood to be controlled by standard pneumatic logical components which are commercially available. As an example of such a component, it was previously explained that each cylinder has an associated spool valve which controls air flow to the cylinder inputs. Similarly, in the description of the operation of the invention, a delay in operation of one cylinder with respect to another cylinder has been desired. The delay would be provided by a standard pneumatic "delay" component. In other instances, it is apparent that the air inputs to a spool valve need only be for a short pulse of air in order to have the spool valve provide a continuous air output on a desired line. In that case, the input to the spool valve would have an "air pulse" pneumatic component. It is thus seen that any person skilled in the pneumatic art could assemble to necessary stock components to provide the desired air flow control to the various cylinders of the invention.

As an example of the pneumatic logic control of a cylinder, consider cylinder 21 which has air pressure supplied to its input 110 except for the time during which the incremental step of movement of magazine 13 occurs. During operation when valve $V_4$ opens, the air in line 104 from valve $V_4$ is provided by an "air pulse" pneumatic component to the input of the shuttle valve associated with cylinder 21 to cause air to be applied to the retract input 109 of cylinder 21. After a time suitable for piston 24 to retract the desired distance, a delayed pulse of air, provided by a "delay" pneumatic component, is provided to the other input of the shuttle valve to cause air to be supplied to extend input 110 of cylinder 21 and to cut-off the air supply to retract input 109. It is seen that the logic for operation is quite simple and capable of being provided by one skilled in the art.

To summarize the operation of the invention, the following table presents events as they occur in the operation of the invention:

| | |
|---|---|
| Step 1. | Machine Connected To Air Source 100. |
| | Pistons 16, 24, 29, 19 extended; |
| | Piston 36 retracted. |
| Step 2. | Insertion Of Magazine 13 Which Contacts Latch 14. |
| | Valve $V_1$ opens to retract pistons 16, 29; |
| | Delay; |
| | Piston 19 retracts. |
| Step 3(A). | A Module Under Test "Passes". |
| | Air switch "PASS" manually or electrically activated by test set; |
| | Piston 36 extends; |
| | Valve $V_2$ opens; |
| | Piston 36 retracts; |
| | Valve $V_3$ opens; |
| | Piston 19 extends; |
| | Valve $V_4$ opens; |
| | Piston 24 retracts; |
| | Delay; |
| | Piston 24 extends; |
| | Delay; |
| | Piston 19 retracts. |
| Step 3(B). | A Module Under Test "Fails". |
| | Operator manually marks "failed" module; |
| | Air switch "FAIL" activated; |
| | Piston 19 extends; |
| | Valve $V_4$ opens; |
| | Piston 24 retracts; |
| | Delay; |
| | Piston 24 extends; |
| | Delay; |
| | Piston 21 retracts. |
| Step 4. | After 33rd Module Has Been Tested. |
| | Latch 14 support contacts valve $V_5$; |
| | Pistons 16, 19, 29 extend; |
| | Latch 14 releases magazine 13; |
| | Valve $V_1$ closes. |
| Step 5. | Initial Condition Ready For Next Magazine. |

Having described a preferred embodiment of the invention, it will now be apparent to one of skill in the art that other embodiments incorporating its concept may be used. It is felt, therefore, that this invention should not be restricted to the disclosed embodiment but rather should be limited only by the spirit and scope of the appended claims.

What is claimed is:

1. Apparatus for use with an electrical test set for electrical testing of electronic modules comprising:
   a container means containing a plurality of electronic modules arranged in successive locations in said container means, each module having electrical connector pins;
   means moving said container means so that each of said modules is sequentially located at a predetermined location;
   connector means at said predetermined location responsive to each successive module at said predetermined location to move to sequentially electrically connect each said module pins to said electrical test set; and
   means responsive to the output signal of said test set actuating said moving means to cause the next successive location of said modules to advance to said predetermined location.

2. The apparatus of claim 1 wherein:
   said moving means being responsive to contact by said container to latch onto said container to cause said container to move to position each of said modules at said predetermined location; and,
   means for sensing when the last of said modules in said container has passed said predetermined location to cause said moving means to move said container in the opposite direction until said container has again passed said predetermined location at which location said latch is released from said container.

3. The apparatus of claim 2 wherein:
   said moving means includes indexing means;
   said container having a plurality of indexing tabs at predetermined locations of said container responsive to said indexing means;
   said indexing means and said indexing tabs in response to said moving means causing said container to sequentially stop at one of a plurality of predetermined container locations which in turn causes said modules arranged in said container to sequentially stop at said predetermined connector location; and
   said indexing means in response to a signal of said test set releases said container thereby allowing said moving means to advance said container to the next successive stop of said predetermined container locations.

4. The apparatus of claim 2 wherein said connector means for electrically connecting each module to said test set comprises:
- an electrical connector of said connector means positioned at said connector means predetermined location and means for moving said connector to make electrical contact with the electrical connector pins of each module when said module is at said predetermined location;
- said connector means further comprising a module guide and module stop, said connector moving means providing pressure to said connector against said pins; and
- the module at said predetermined connector location being forced into said module guide and against said stop by said connector to cause said electrical contact of said connectors to be a pressure contact.

5. Apparatus for electrical testing by an electrical test set of electronic modules carried in a magazine comprising:
- a magazine containing a plurality of modules;
- each module having an electrical pin connector;
- a magazine feed means for indexing said magazine through successive module positions to provide each module at a predetermined location in succession;
- a test set;
- a connector means located at said predetermined location and connected to said test set;
- said connector means making electrical connection to the pin connector of each module when each module is indexed to said predetermined location to electrically connect each module to said test set;
- means responsive to a signal from said test set indicative of the module having passed or failed its electrical test to mark said tested module in response to said signal; and
- means responsive to a signal from said test set to index said magazine to cause the next successive module to be advanced to the predetermined location to be positioned for testing.

6. A method for production testing of electrical modules comprising:
- loading said modules in serial predetermined locations in a magazine;
- inserting said loaded magazine into an indexing mechanism;
- advancing said magazine by said indexing mechanism in a stepped sequence to cause each module to have a predetermined location;
- electrically connecting each module when at said predetermined location to an electrical test set;
- electrically testing said module to determine whether said module has passed or failed;
- marking said module in accordance with its passing or failing said electrical test;
- removing said electrical connection from said tested module; and
- advancing said magazine so that the next module is in said predetermined location.

7. A method for production testing of electrical modules comprising:
- loading said modules in serial predetermined locations in a magazine;
- inserting said loaded magazine into an indexing mechanism;
- advancing said magazine in a stepped sequence to cause each module to have a predetermined location;
- urging an electrical connector into electrical contact with the electrical terminals of said module when each of said modules is in said predetermined location;
- electrically testing each module in said predetermined location;
- removing said electrical connector from electrical contact with the electrical terminals of said module after said module has been tested; and
- advancing said magazine so that the next module to be tested is at said predetermined location.

8. Apparatus to be used in conjunction with an electrical test set for electrical testing of electronic modules arranged in successive predetermined positions in a magazine having indexing tabs corresponding to said predetermined positions comprising:
- a support member for supporting said magazine;
- an indexing mechanism attached to said support member for engaging said tabs in sequence;
- means for pulling said magazine to cause one of the tabs to press against said indexing mechanism, said indexing mechanism in combination with said urging means causing each module in said magazine to successively assume a predetermined location;
- connector means located at said predetermined location, said connector means being actuated subsequent to said indexing mechanism providing a successive module to be tested, said actuated connector means making electrical contact with said successive module and connecting the module to an electrical test set;
- said connector means also being responsive to a signal from said test set indicating completion of said test to remove itself from electrical contact with said module, said connector means when so removed providing a signal to said indexing means; and,
- said indexing mechanism being responsive to said connector means signal to cause said magazine to advance the next successive module to said predetermined location for testing.

9. The apparatus of claim 8 wherein:
- said pulling means in conjunction with said indexing mechanism causes the magazine to move in steps to cause each module in said magazine to stop at said predetermined location and to be tested, said indexing and testing process continuing until all modules have been tested, said magazine tabs terminating at a location on said magazine such that after said last module has been tested, said magazine tabs will have passed said indexing mechanism and said magazine will continue to be pulled by said pulling mechanism;
- limit switch means responsive to the position of said magazine to provide a signal to reverse the direction of said pulling means to thereby push on said magazine to push said magazine beyond said indexing mechanism; and,
- an indexing mechanism support responsive to said limit switch to cause said indexing mechanism to be out of engagement with the tabs of said magazine thereby allowing said magazine to be pushed beyond said indexing mechanism.

10. Apparatus for electrical testing of electronic modules arranged in a magazine comprising:
- a breech suitable for the insertion of said magazine into an end thereof;
- a latch for engaging an end of said magazine when inserted in said breech;
- a feed cylinder piston attached to said latch;
- means responsive to said latch when said magazine is engaged by said latch to energize said feed cylinder to cause it to pull said magazine into said breech;
- a support member pivotally attached to said breech;
- an indexing pawl pivotally attached at one end to said support member and having first and second positions;
- an indexing cylinder piston pivotally attached to the other end of said indexing pawl;
- means for providing a test signal from an electronic module; and,
- means responsive to said test set signal for controlling fluid flow into said indexing cylinder to extend and retract the piston of said indexing cylinder to cause said indexing pawl to be in said first and second position, respectively, to allow said magazine to advance said modules in sequence to a position to be tested by said test signal means.

* * * * *